US009209548B2

(12) United States Patent
Henry et al.

(10) Patent No.: US 9,209,548 B2
(45) Date of Patent: Dec. 8, 2015

(54) ELECTRICAL PROBE WITH ROTATABLE PLUNGER

(71) Applicant: INTERCONNECT DEVICES, INC., Kansas City, KS (US)

(72) Inventors: David Wayne Henry, Platte City, MO (US); Kiley Ray Beard, Kearney, MO (US)

(73) Assignee: Interconnect Devices, Inc., Kanasas City, KS (US)

(*) Notice: Subject to any disclaimer, the term of this patent is extended or adjusted under 35 U.S.C. 154(b) by 63 days.

(21) Appl. No.: 14/242,316

(22) Filed: Apr. 1, 2014

(65) Prior Publication Data

US 2015/0280344 A1   Oct. 1, 2015

(51) Int. Cl.
*H01R 13/24* (2006.01)
*H01R 43/20* (2006.01)

(52) U.S. Cl.
CPC ............ *H01R 13/2421* (2013.01); *H01R 43/20* (2013.01)

(58) Field of Classification Search
CPC ...... H01R 13/2421; H01R 43/20; H01R 4/48; H01R 13/2471; H01R 12/52; G01R 1/06722; G06F 3/01
USPC .......................................................... 439/700
See application file for complete search history.

(56) References Cited

U.S. PATENT DOCUMENTS

| | | |
|---|---|---|
| 3,378,810 A | 4/1968 | Dorrell |
| 3,458,851 A | 7/1969 | Webb |
| 4,307,928 A | 12/1981 | Petlock, Jr. |
| 4,743,201 A | 5/1988 | Robinson et al. |
| 5,009,613 A | 4/1991 | Langgard et al. |
| 5,032,787 A | 7/1991 | Johnston et al. |
| 5,045,780 A | 9/1991 | Swart |
| 5,391,995 A | 2/1995 | Johnston et al. |
| 5,456,621 A | 10/1995 | Gan |
| 5,518,410 A | 5/1996 | Masami |
| 6,104,205 A | 8/2000 | Mawby |
| 6,758,682 B1* | 7/2004 | Kosmala ................ 439/66 |
| 7,008,270 B1* | 3/2006 | Huh et al. .............. 439/700 |
| 7,102,369 B2 | 9/2006 | Jung |
| 7,148,713 B1* | 12/2006 | Meek et al. ............ 324/754.14 |
| 7,362,118 B2* | 4/2008 | Henry et al. ........... 324/755.05 |
| 7,728,611 B1* | 6/2010 | Kraynak ................. 324/754.09 |
| 8,506,307 B2 | 8/2013 | Henry et al. |
| 8,926,379 B2* | 1/2015 | Vinther .................. 439/817 |
| 2008/0100325 A1* | 5/2008 | Sinclair .................. 324/761 |
| 2008/0143366 A1* | 6/2008 | Kurotori et al. ........ 324/761 |
| 2008/0257027 A1* | 10/2008 | Wu ......................... 73/146.8 |

FOREIGN PATENT DOCUMENTS

JP        61-196170        8/1986

* cited by examiner

*Primary Examiner* — Jean F Duverne
(74) *Attorney, Agent, or Firm* — Snell & Wilmer LLP

(57) ABSTRACT

This disclosure provides for an electrical probe, which can include a shell extending along a longitudinal axis and defining an internal cavity with an opening at a first end, where the shell can include a neck portion defined by a hollow polygonal shaft twisted about the longitudinal axis to form an internal cam surface. The electrical probe can also include a plunger slidably received in the internal cavity. The plunger can include a tip configured to extend at least partially through the opening at the first end and a cam element integrally formed with the tip and having a cross-sectional shape substantially corresponding to a cross-sectional shape of the hollow polygonal shaft, such that, when the plunger is reciprocated along the longitudinal axis of the shell, the cam element can engage with the internal cam surface of the neck portion to cause rotation of the tip.

25 Claims, 4 Drawing Sheets

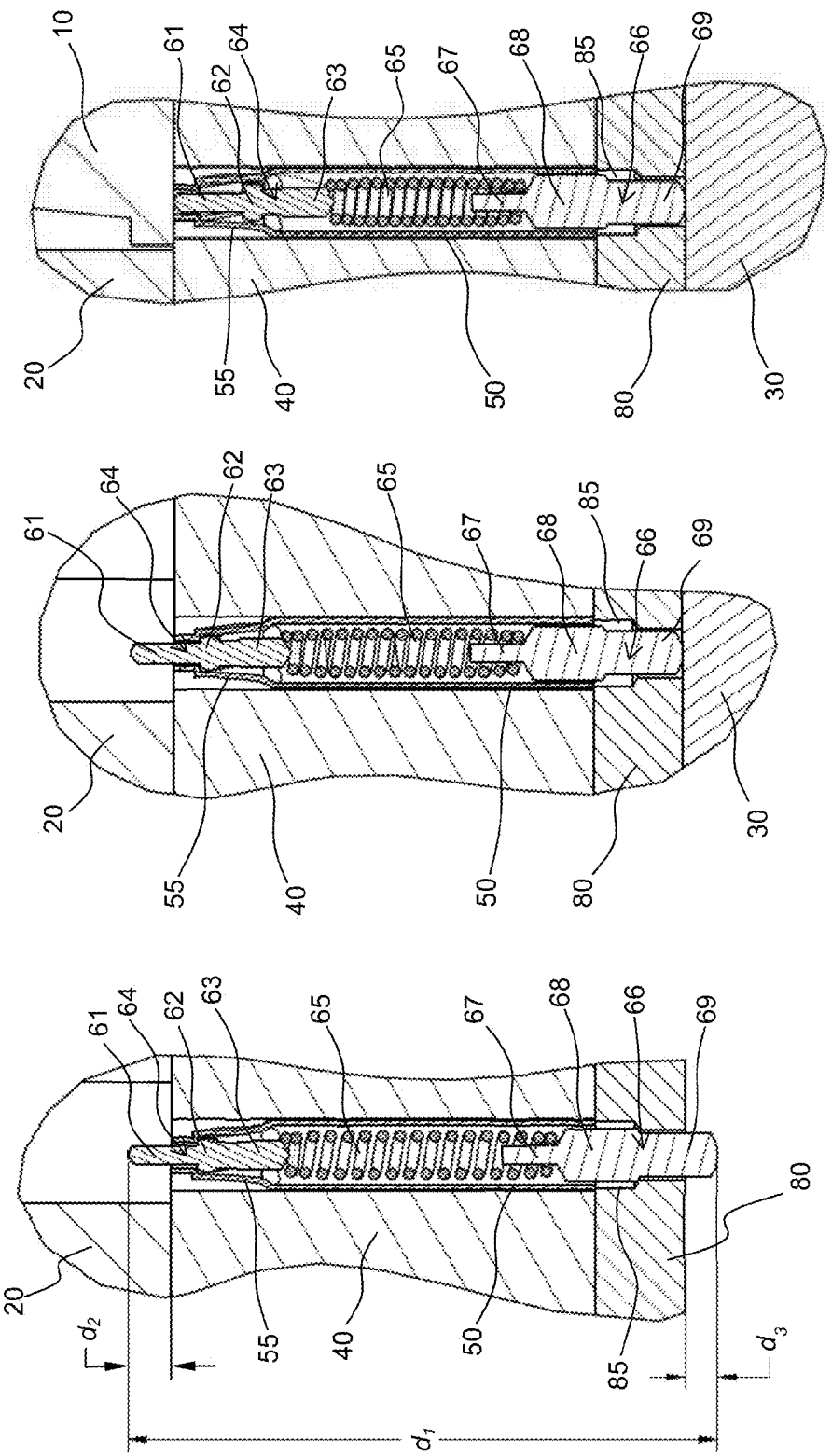

ELECTRICAL PROBE WITH ROTATABLE PLUNGER

TECHNICAL FIELD

The present disclosure relates generally to an electrical connector, and more particularly, to an electrical probe having a rotatable plunger and related fabrication methods.

DESCRIPTION OF RELATED ART

In the electronics and semiconductor industries, a test system is used to test and qualify integrated circuit (IC) chips as part of the manufacturing process. The test system typically includes a socket body for receiving an IC chip, a printed circuit board (PCB) for testing the IC chip, and an electrical connector for providing an electrical connection between the IC chip and the PCB. The electrical connector may include a plurality of electrical probes positioned inside the socket body. Each electrical probe may include a pair of plungers and a spring disposed between the pair of plungers. The plungers and the spring may be received inside a shell or casing, such that the spring exerts biasing force against the plungers to bias the plungers outwardly in relation to the shell.

Certain types of electrical probes, however, may not be suitable for testing certain types of IC chips. For example, a quad-flat no-leads (QFN) chip has relatively small exposed contact surfaces for electrical connection. And, in some instances, these surfaces may be covered with debris or contaminant produced during the manufacturing process, which may interfere with the electrical connection between the plungers and the IC chip. Thus, an electrical probe that reciprocates only in a vertical direction may not be adequate to ensure proper electrical connection for testing a chip.

SUMMARY OF THE INVENTION

Various exemplary embodiments of the present disclosure may provide an electrical probe with a rotatable plunger, such that a tip of the plunger can rotate about its axis to scrub away debris or contaminants covering the IC chip in the area of contact and thereby produce enhanced electrical connection with the IC chip.

According to one exemplary aspect of the present disclosure, an electrical probe can include a shell extending along a longitudinal axis and defining an internal cavity with an opening at a first end, where the shell can include a neck portion defined by a hollow polygonal shaft twisted about the longitudinal axis to form an internal cam surface. The electrical probe can also include a plunger slidably received in the internal cavity. The plunger can include a tip configured to extend at least partially through the opening at the first end and a cam element integrally formed with the tip, the cam element having a defined shape in a plane substantially perpendicular to the longitudinal axis, an outer perimeter of the defined shape being substantially congruent to, and less than, an inner perimeter of a cross-sectional portion of the hollow polygonal shaft. In some exemplary embodiments, when the plunger is reciprocated along the longitudinal axis of the shell, the cam element can engage with the internal cam surface of the neck portion to cause rotation of the tip. The plunger can also include a biasing device configured to exert a biasing force on the plunger.

In another exemplary aspect, an electrical connector can include a socket body comprising a plurality of socket cavities and a plurality of electrical probes disposed inside the corresponding plurality of socket cavities. Each of the plurality of electrical probes can include a shell affixed to an internal surface of each corresponding socket cavity, where the shell can extend along a longitudinal axis and define an internal cavity with an opening at a first end. The shell can also include a neck portion defined by a hollow polygonal shaft twisted about the longitudinal axis to form an internal cam surface. The electrical probe can also include a plunger slidably received in the internal cavity, where the plunger can include a tip configured to extend at least partially through the opening at the first end and a cam element integrally formed with the tip, the cam element having a defined shape in a plane substantially perpendicular to the longitudinal axis, an outer perimeter of the defined shape being substantially congruent to, and less than, an inner perimeter of a cross-sectional portion of the hollow polygonal shaft. In an exemplary embodiment, when the plunger is reciprocated along the longitudinal axis of the shell, the cam element can engage with the internal cam surface of the neck portion to cause rotation of the tip. The electrical probe can also include a biasing device configured to exert a biasing force on the plunger.

According to some exemplary aspects, a method of manufacturing an electrical connector is provided. The method can include inserting a plated mandrel into a socket cavity of a socket body, where the plated mandrel can have a plating layer on an outer surface of a mandrel. The mandrel can include a neck portion defined by a substantially polygonal shaft twisted about a longitudinal axis. The method can further include securing the plated mandrel into the socket cavity and removing the mandrel from the socket cavity while leaving at least a portion of the plating layer to form a shell secured to the socket cavity. In some exemplary embodiments, an internal cavity of the shell can include a cam surface defined by the twisted polygonal shaft of the neck portion. The method can also include inserting a plunger and a biasing device into the internal cavity of the shell, where the plunger can include a tip and a cam element integrally formed with the tip, the cam element having a defined shape in a plane substantially perpendicular to the longitudinal axis, an outer perimeter of the defined shape being substantially congruent to, and less than, an inner perimeter of a cross-sectional portion of the polygonal shaft. According to one exemplary embodiment, when the plunger is reciprocated along the longitudinal axis, the cam element can engage with the cam surface of the shell to cause rotation of the tip.

Additional objects and advantages of the present disclosure will be set forth in part in the description which follows, and in part will be obvious from the description, or may be learned by practice of the present disclosure. The objects and advantages of the present disclosure will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate various exemplary embodiments consistent with the invention and, together with the description, serve to explain the principles of the invention.

FIGS. 3-5 are cross-sectional views of the electrical probe of FIG. 2 in a free state, a PCB-pressed state, and a testing state, respectively;

DESCRIPTION OF THE EMBODIMENTS

Reference will now be made in detail to exemplary embodiments of the present disclosure, examples of which are illustrated in the accompanying drawings. Wherever possible, the same reference numbers will be used throughout the drawings to refer to the same or like parts.

Figure 1:
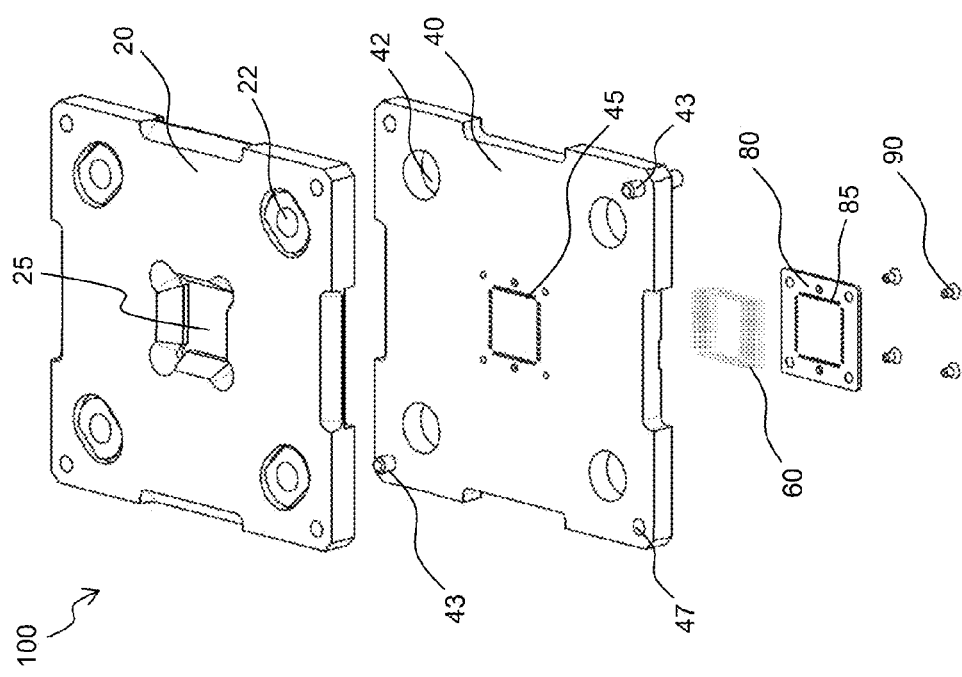
FIG. 1 is a perspective view illustrating various components of a test system, according to one exemplary embodiment of the present disclosure.

FIG. 1 illustrates a test system 100, in which electrical probes of the present disclosure may be used, according to one exemplary embodiment. While various exemplary embodiments of the present disclosure will be described in connection with a particular test system for testing an IC chip, it should be understood that the present disclosure can be applied to, or used in connection with, a wide variety of other test systems and applications involving many different types of electronics and/or semiconductor devices.

Referring to FIG. 1, test system 100 can include an alignment plate 20 for receiving an IC chip (not shown) for testing, a socket body 40 having a plurality of socket cavities 45, a plurality of electrical probes 60 mounted in respective socket cavities 45 of socket body 40, and a retainer 80 configured to hold electrical probes 60 in socket cavities 45.

Alignment plate 20 can include a chip cavity 25 shaped and sized to receive an IC chip to be tested. Alignment plate 20 can also be configured such that, when an IC chip is placed in chip cavity 25, the contact pads of the IC chip can be aligned with corresponding electrical contacts of electrical probes 60 mounted in socket body 40. Alignment plate 20 can also include suitable fasteners for fastening alignment plate 20 to socket body 40 and/or to a suitable support frame. For example, as shown in FIG. 1, alignment plate 20 can include threaded inserts 22 or screws that can extend to, and engage with, corresponding holes 42 formed in socket body 40. Each of alignment plate 20 and socket body 40 can also include suitable alignment features 43 and alignment holes 47 to align alignment plate 20 and socket body 40 with respect to one another.

Retainer 80 can form a substantially flat plate having one or more retainer cavities 85 aligned with respective socket cavities 45 of socket body 40. In some exemplary embodiments, socket body 40 can include a recessed portion (not shown) on a bottom surface that faces retainer 80 to receive retainer 80 therein. Retainer 80 can be secured to socket body 40 with suitable fasteners, such as screws 90.

Alignment plate 20, socket body 40, and retainer 80 can be generally planar and can be disposed adjacent to one another. For example, alignment plate 20 can lie on top of socket body 40, and socket body 40 can lie on top of retainer 80, as shown in FIG. 1.

Figure 2:
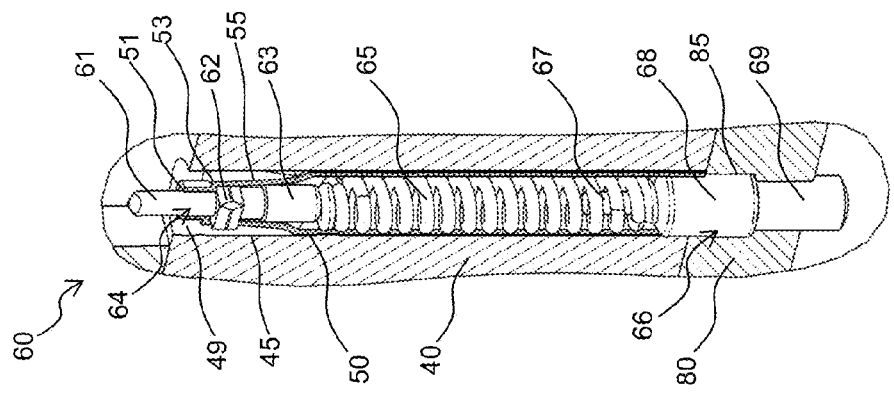
FIG. 2 is a cross-sectional view of an electrical probe disposed in a socket cavity, according to one exemplary embodiment of the present disclosure.

FIG. 2 illustrates electrical probe 60, according to one exemplary embodiment. Electrical probe 60 can be an interconnector configured to transmit electrical signals between two electrical components. For example, according to an exemplary embodiment, electrical probe 60 can be provided in test system 100 to electrically connect an IC chip to a PCB used for testing the IC chip.

As mentioned above, each electrical probe 60 can be mounted to a corresponding socket cavity 45 of socket body 40. Socket body 40 can be formed of an insulating substrate to electrically isolate the plurality of electrical probes 60. As will be described in more detail later, electrical probes 60 can be directly assembled into socket cavities 45 of socket body 40. In an alternative embodiment, electrical probes 60 can be pre-assembled in a shell or casing, which can then be soldered or press-fit into corresponding socket cavities 45.

As shown in FIG. 2, electrical probe 60 can be disposed in an aligned pair of socket cavity 45 of socket body 40 and retainer cavity 85 of retainer 80, where socket cavity 45 is aligned with a corresponding contact pad of the IC chip and retainer cavity 85 is aligned with a corresponding contact pad of the PCB. Thus, electrical probe 60 disposed in the aligned pair of socket cavity 45 and retainer cavity 85 can electrically connect between the corresponding contact pad of the IC chip placed in chip cavity 25 and the corresponding contact pad of the PCB placed underneath retainer 80.

The number of electrical probes 60 (and the corresponding number of socket cavities 45 and retainer cavities 85) can vary depending on a number of factors, including, but not limited to, the type and configuration of the IC chip being tested, the desired data rate, and the structure of the PCB or device being electrically connected by electrical probe 60.

As shown in FIG. 2, electrical probe 60 can include a top plunger 64, a bottom plunger 66, and a biasing device 65 disposed between top and bottom plungers 64 and 66. Electrical probe 60 can also include a shell 50 configured to substantially enclose top plunger 64, bottom plunger 66, and biasing device 65, where all of top plunger 64, biasing device 65, and bottom plunger 66 are movably arranged inside shell 50.

Shell 50 can be generally tubular and can be formed of a conductive material, such as a plating alloy (e.g., nickel and/or gold). Shell 50 can be formed inside socket cavity 45 such that at least a portion of its outer surface is isomorphic to an internal surface of socket cavity 45. The cross-section of shell 50 can be circular, oval, square, rectangular, or any other shape. Shell 50 can include multiple sections with different cross-sectional shapes and/or dimensions.

In one exemplary embodiment, shell 50 can be formed directly inside socket cavity 45. A suitable binding material, such as, epoxy, can be used to fill the space between shell 50 and socket cavity 45 and thereby hold shell 50 in socket cavity 45. Alternatively or additionally, shell 50 can be press-fit into socket cavity 45.

Top plunger 64 can include a tip 61 at a distal end, a tail 63 at a proximal end opposite the distal end, and a cam element 62 disposed between tip 61 and tail 63. Cam element 62 can extend laterally from a shaft portion between tip 61 and tail 63 in a plane substantially perpendicular to the longitudinal axis of top plunger 64. Tip 61, cam element 62, and tail 63 can be integrally formed as a single unit.

Cam element 62 can have a substantially polygonal shape. For example, in the embodiment shown in FIG. 2, cam element 62 can be configured as a square having a thickness (along the axis of top plunger 64) smaller than its width (in a plane perpendicular to the axis of top plunger 64). In some exemplary embodiments, the side edges of cam element 62, formed by vertices of a polygon, can be chamfered to form a smooth transition between side faces.

Shell 50 can include a distal opening 51 through which tip 61 of top plunger 64 can extend to electrically contact a corresponding contact pad of an IC chip. Shell 50 can also include a shoulder 53 configured to abut a top surface of cam element 62, serving as a stopper for preventing tip 61 from extending more than a predetermined distance.

The top portion of shell 50 can include a neck portion 55 defining an internal cavity configured to cooperate or engage with cam element 62 of top plunger 64 to cause top plunger 64 to rotate as it reciprocates up and down along its longitudinal axis. For example, as will be described in more detail herein, the internal cavity of neck portion 55 can be defined by a hollow polygonal shaft (e.g., square shaft) twisted about a central axis, thus forming a generally spiral cam surface that is shaped and sized to receive and engage with cam element 62. Accordingly, as top plunger 64 reciprocates up and down along its axis, the peripheral side surface of cam element 62 can contact and ride along the cam surface of neck portion 55, which causes top plunger 64 including tip 61 to rotate about its axis. Although neck portion 55 of shell 50 has a cross-sectional shape of a square in the disclosed embodiment of FIG. 2, it should be understood that neck portion 55 can have any other polygonal shape, such as, for example, a triangle or pentagon. Further still, consistent with this disclosure, it should be understood that neck portion 55 is not limited to a polygonal shapes (whether regular or irregular), but can exhibit any non-circular shape, such as a substantially elliptical shape, an "egg" shape, or any other irregular shape.

In some exemplary embodiments, the cross-sectional area of neck portion 55 can vary along at least a portion of its length. For example, in the disclosed embodiment shown in FIG. 2, the cross-sectional area of neck portion 55 can gradually increase from about a midpoint along its length to the bottom of neck portion 55, which can serve as a transition between the upper portion of neck portion 55 that defines the cam surface and a main body of shell 50 that abuts the internal surface of socket cavity 45.

According to various exemplary embodiments, the angular displacement (e.g., the degree of rotation) of top plunger 64 with respect to the axis of top plunger 64 as top plunger 64 travels from a free state (e.g., FIG. 3) to a testing state (e.g., FIG. 5) can be less than about 90 degrees. For example, in one exemplary embodiment, the angle of twist in the internal cavity of neck portion 55 can range from about 30 degrees to about 40 degrees with respect to the central axis and over the length of neck portion 55, which can range from about 0.25 mm to about 0.35 mm. Since top plunger 64 travels a distance of about 0.2 mm in the embodiment described above with reference to FIGS. 3-5, the angular displacement can be about 23 degrees, disregarding nominal backlash and tolerances. Having such a relatively small angular displacement of top plunger 64 may prevent excessive scrubbing on the contact pad of IC chip 10, which can cause damages to the contact pad and create undesirable debris and/or contaminants. It should be understood that the disclosed dimensions are merely examples only and are provided to facilitate the explanation of various possible configurations of the present disclosure. In some exemplary embodiments, the angular displacement can be more than 90 degrees.

In some exemplary embodiments, shell 50 can also include a crimp (not shown) associated (e.g., affixed) with shell 50. The crimp can be shaped and sized to capture cam element 62, so that top plunger 64 does not displace below a predetermined position.

Bottom plunger 66 can include a tail 68 and a tip 69 extending from tail 68 to electrically contact a corresponding contact of a PCB placed underneath retainer 80 (see, e.g., FIG. 4). Bottom plunger 66 can also include a center projection 67 extending axially from tail 68 in a direction opposite to tip 69. Center projection 67 can be shaped and sized to be inserted into a hollow center of biasing device 65, as shown in FIG. 2. The cross-section of tail 68 can be greater than that of tip 69, such that retainer cavity 85 allows the passage of only tip 69 while at least partially preventing tail 68 from passing entirely therethrough so as to hold bottom plunger 66 inside socket cavity 45 and retainer cavity 85.

Biasing device 65 can be a spring or any other device capable of exerting a biasing force on one or both of top and bottom plungers 64 and 66 to bias them outwardly from shell 50. Biasing device 65 can have a cross-section that is shaped to correspond to the shape of the internal surface of shell 50.

Tip 61 and tail 63 of top plunger 64 and tip 69 and tail 68 of bottom plunger 66 can be formed of an electrically conductive material to allow an electrical connection between plungers 64 and 66 and shell 50. Biasing device 65 can also be formed of an electrically conductive material and can also permit the electrical connection between the IC chip and the PCB.

FIG. 3 illustrates electrical probe 60 in a free state, where no external force is applied against either top plunger 64 or bottom plunger 66. At this state, top plunger 64 and bottom plunger 66 are extended outwardly by the force of biasing device 65. For example, in the disclosed embodiment of FIG. 3, tip 61 of top plunger 64 can protrude out of distal opening 51 of shell 50, and tip 69 of bottom plunger 66 can protrude out of the bottom of retainer cavity 85 of retainer 80. By way of example only, in the free state shown in FIG. 3, the distance $d_1$ between tip 61 of top plunger 64 and tip 69 of bottom plunger 66 may be approximately 2.75 mm; the distance $d_2$ between tip 61 of top plunger 64 and the top surface of socket body 40 can be approximately 0.20 mm; and the distance $d_3$ between tip 69 of bottom plunger 66 and the bottom surface of socket body 40 can be approximately 0.15 mm. The spring force in the free state can be approximately 6.2 gram-force (gf).

FIG. 4 illustrates electrical probe 60 in a PCB-pressed state, where PCB 30 for testing is brought into contact with the bottom surface of socket body 40, such that its contact pads can contact corresponding tips 69 of bottom plungers 66. At this state, bottom plunger 66 can be depressed inwardly into shell 50 under a force directed inwardly towards biasing device 65. By way of example only, the spring force in this PCB-pressed state can be approximately 15.3 gf.

FIG. 5 illustrates electrical probe 60 in a testing state, where an IC chip 10 is placed in chip cavity 25 of alignment plate 20 to allow the contact pads of IC chip 10 to align and contact with corresponding tips 61 of top plungers 64. At this state, IC chip 10 and PCB 30 can exert forces against respective tips 61 and 69 of top and bottom plungers 64 and 66, respectively, causing both plungers 64 and 66 to be depressed inwardly into shell 50. As top plunger 64 is being depressed into shell 50, the peripheral side surface of cam element 62 can contact and follow, or otherwise engage with, the cam surface defined by the internal cavity of neck portion 55 of shell 50. This can cause top plunger 64 to rotate about its axis as it is being depressed. Rotation of top plunger 64 can allow tip 61 of top plunger 64 to scrub away any debris or contaminants that may be present on the contact pad of IC chip 10 in the area of contact, thereby enhancing electrical contact between tip 61 of top plunger 64 and the corresponding contact pad of IC chip 10. By way of example only, The spring force in the test state can be approximately 27.4 gf.

Figure 6:
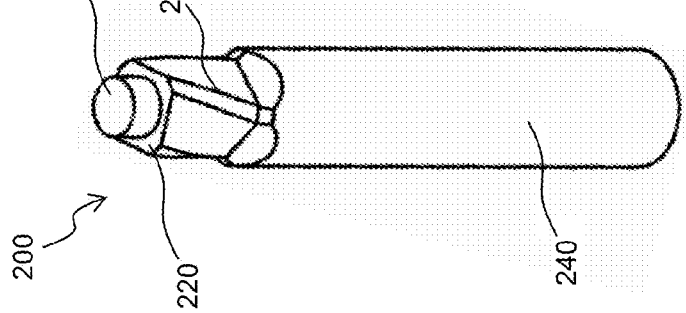
FIG. 6 is a perspective view of a mandrel used to form a shell of an electrical probe, according to one exemplary embodiment.

FIGS. 6-10 illustrate a method of manufacturing an electrical probe, such as electrical probe 60 shown in FIGS. 2-5, according to one exemplary embodiment. As shown in FIG. 6, a mandrel 200 having an outer shape substantially corresponding to a desired shape of a shell of the electrical probe can be provided. Mandrel 200 can be machined from a wire or can be molded, such as, for example, by injection-molding.

Mandrel 200 can be formed of a material that can be dissolved or removed chemically, such as by chemical etching. In some exemplary embodiments, mandrel 200 can be formed from an aluminum alloy. Mandrel 200 can include a tip portion 210, a shoulder portion 220, a neck portion 230, and a body portion 240. Body portion 240 can be generally cylindrical and have a cross-sectional area larger than neck portion 230. In an embodiment, neck portion 230 can be formed of a generally polygonal shaft twisted about its axis to define a spiral or helical outer surface. The cross-sectional area of neck portion 230 can gradually increase from the top to the bottom along its length. In some exemplary embodiments, the side edges of neck portion 230 can be chamfered, as shown in FIG. 6. The top end of neck portion 230 can be terminated with shoulder portion 240 having a plane substantially perpendicular to the longitudinal axis of mandrel 200. Tip portion 210 can have a cross-sectional area smaller than that of shoulder portion 240 and can extend from shoulder portion 240 along the longitudinal axis of mandrel 200.

Although neck portion 230 is depicted as having, generally, a cross-sectional shape of a square (where the transitions at the "corners" or vertices of the polygon, for example, can exhibit anything between a sharp transition between two adjacent edges, to a coarser transition including a beveled edge or chamfer between two adjacent edges—as is depicted in FIG. 6—to a smooth transition between two adjacent edges that is substantially curved or "rounded"), it should be understood that neck portion 230 can have any other polygonal shape, such as, for example, a triangle or pentagon, with the same potential variation in transition at any "corner" or vertex of the polygon.

Figure 7:
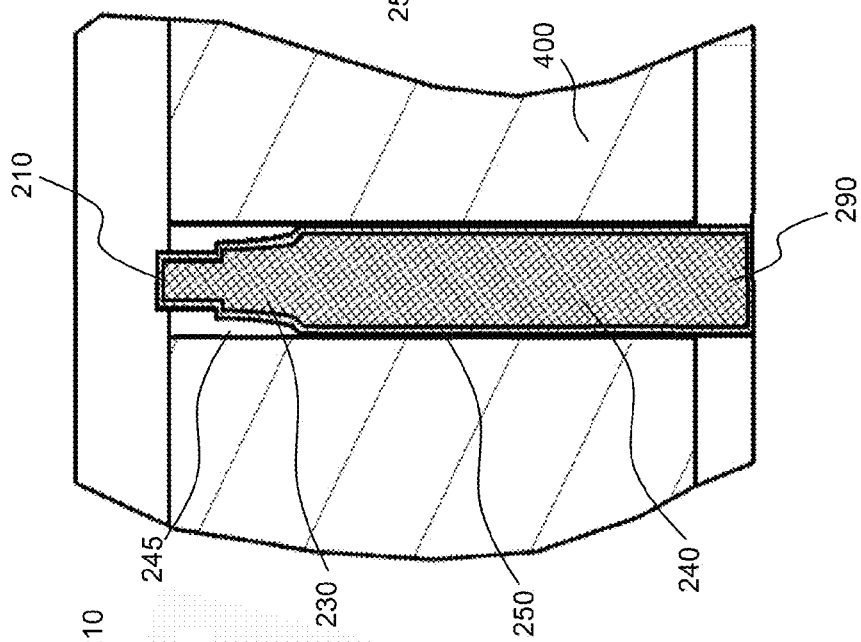
FIG. 7 is a cross-sectional view of a socket body with a plated mandrel positioned in a socket cavity.

Mandrel 200 can then be plated with one or more layers 250 (FIG. 7). In one exemplary embodiment, mandrel 200 can be plated with one or more plating metals, such as, for example, gold, nickel, and other plating alloys. The plating material and thickness of layer 250 can be determined based on the particular application.

Next, as shown in FIG. 7, mandrel 200 with layer 250 can be secured to a socket cavity 245 by injecting a suitable binding material, such as epoxy, into the gap between layer 250 and the internal surface of socket cavity 245. As a result, the external surface of layer 250 can be affixed to the internal surface of socket cavity 245. Alternatively or additionally, mandrel 200 with layer 250 may be press-fit into socket cavity 245, where the outer surface of body portion 240 is compressed into socket cavity, thereby affixing the external surface of layer 250 to the internal surface of socket cavity 245.

Socket cavity 245 can be formed in a socket body 400 and may extend through the entire thickness of socket body 400. Socket cavity 245 can have a substantially uniform cross-sectional area along its length, as shown in FIG. 7. Alternatively, the cross-sectional area of socket cavity 245 can vary along its length. For example, socket cavity 245 can have an internal surface closely matching the outer surface of mandrel 200 with layer 250.

Figure 8:
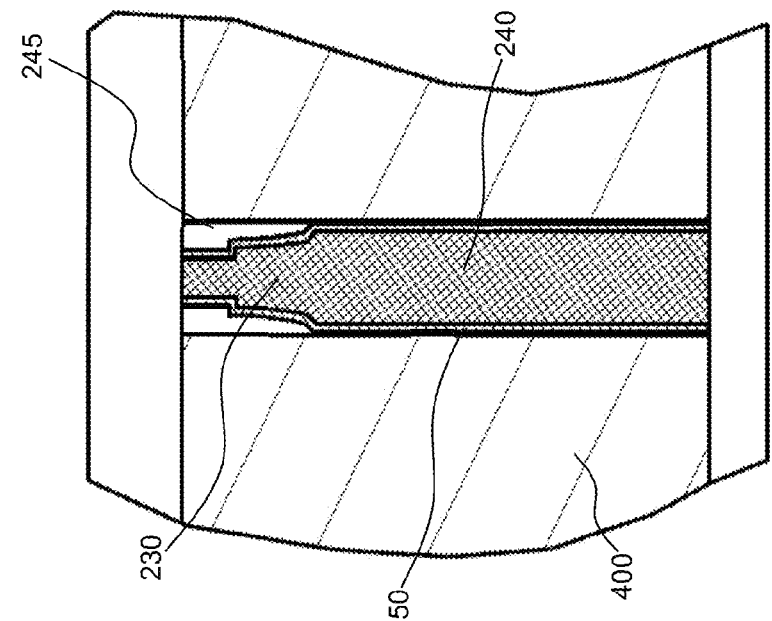
FIG. 8 is a cross-sectional view of the socket body shown in FIG. 7 after the top and bottom ends of the plated mandrel are removed.

After mandrel 200 with layer 250 is securely affixed inside socket cavity 245, and the binding material is substantially cured, top and bottom ends 210 and 290 of mandrel 200, which protrude out of the top and bottom surfaces, respectively, of socket body 400, can be removed (e.g., machined), such that layer 250 and mandrel 200 are flush with the top and bottom surfaces of socket body 400, as shown in FIG. 8. Any other method known in the art for removing ends 210 and 290 can be used alternatively or additionally.

Figure 9:
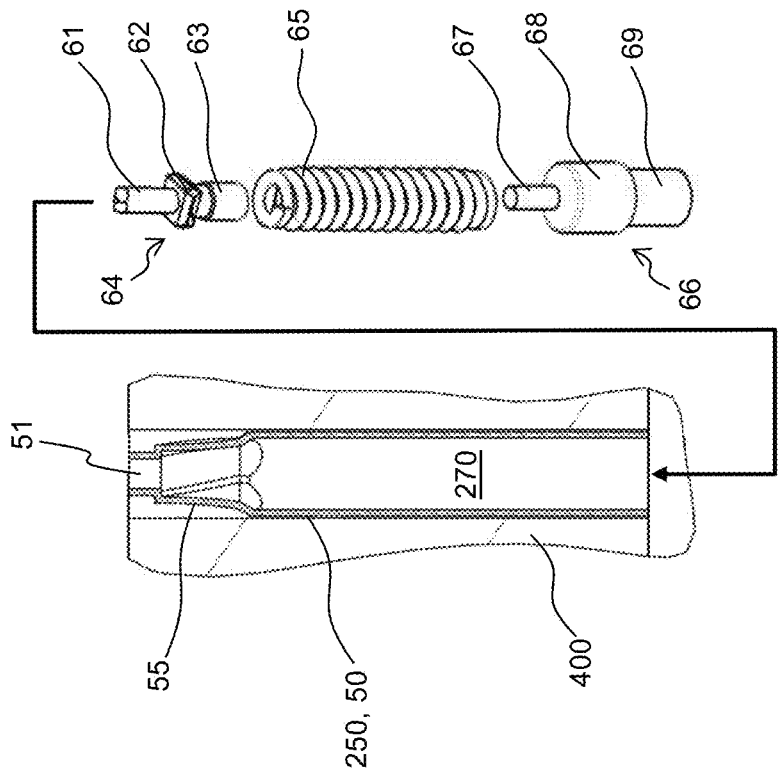
FIG. 9 is a cross-sectional view of the socket body shown in FIG. 8 after the mandrel is removed.

Once ends 210 and 290 of mandrel 200 with layer 250 are removed, mandrel 200 with layer 250 can be exposed from both ends. With the exposed ends, mandrel 200 can then be dissolved and/or chemically removed (e.g., via chemical etching), leaving only layer 250 in socket cavity 245, as shown in FIG. 9. Layer 250 in socket cavity 245 can then form shell 50 described above with reference to FIGS. 2-5.

Figure 10:
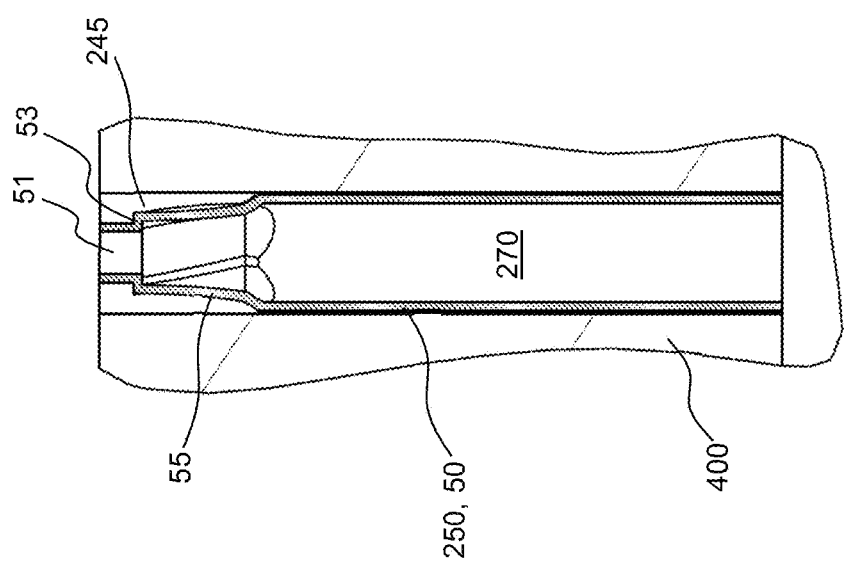
FIG. 10 is a schematic illustrating an exemplary assembly of the electrical probe of FIG. 2.

As shown in FIG. 10, to form electrical probe 60 of FIGS. 2-5, top plunger 64, biasing device 65, and bottom plunger 66 can be inserted into a socket cavity 270 defined by the internal surface of layer 250 (referred to as shell 50, hereinafter). For example, in one exemplary embodiment, top plunger 64 can be inserted into socket cavity 270 with its tip 61 extending at least partially through distal opening 51 of shell 50. Subsequently, biasing device 65 and bottom plunger 66 can be inserted into shell cavity 270. Biasing device 65 can be positioned between respective tails 63 and 67 of respective top and bottom plungers 64 and 66. Next, retainer 80 can be positioned against a bottom surface of socket body 400, such that tip 69 of bottom plunger 66 can extend through a corresponding retainer cavity (e.g., retainer cavity 85 shown in FIG. 2). Retainer 80 can serve to retain and limit the sliding movement of top and bottom plungers 64 and 66 and biasing device 65 inside shell 50.

It will be apparent to those skilled in the art that various modifications and variations can be made in the disclosed systems and processes without departing from the scope of the disclosure. That is, other embodiments will be apparent to those skilled in the art from consideration of the specification and practice of the disclosure. It is intended that the specification and examples be considered as exemplary only, with a true scope being indicated by the following claims and their equivalents.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An electrical probe comprising:
  a shell extending along a longitudinal axis and defining an internal cavity with an opening at a first end, the shell comprising a neck portion defined by a hollow polygonal shaft twisted about the longitudinal axis to form an internal cam surface;
  a plunger slidably received in the internal cavity, the plunger comprising:
    a tip configured to extend at least partially through the opening at the first end; and
    a cam element integrally formed with the tip, the cam element having a defined shape in a plane substantially perpendicular to the longitudinal axis, an outer perimeter of the defined shape being substantially congruent to, and less than, an inner perimeter of a cross-sectional portion of the hollow polygonal shaft, such that, when the plunger is reciprocated along the longitudinal axis of the shell, the cam element engages with the internal cam surface of the neck portion to cause rotation of the tip; and a biasing device configured to exert a biasing force on the plunger.

2. The electrical probe of claim 1, wherein the cam element comprises substantially a polygonal plate.

3. The electrical probe of claim 2, wherein the cam element comprises a square plate having a thickness along the longitudinal axis smaller than a width in the plane substantially perpendicular to the longitudinal axis.

4. The electrical probe of claim 2, wherein the cam element is substantially non-twisted.

5. The electrical probe of claim 2, wherein at least one vertex of the polygonal plate is chamfered between two adjacent sides of the polygonal plate.

6. The electrical probe of claim 1, wherein the shell further comprises a shoulder configured to abut a surface of the cam element to prevent the tip of the plunger from extending through the opening at the first end more than a predetermined distance.

7. The electrical probe of claim 1, wherein the internal cam surface formed by the twisted hollow polygonal shaft comprises a spiral cam surface shaped and sized to receive the cam element.

8. The electrical probe of claim 1, wherein the hollow polygonal shaft that defines the neck portion is twisted less than approximately 90 degrees about the longitudinal axis.

9. The electrical probe of claim 1, wherein the shell is affixed to a socket cavity of a socket body.

10. The electrical probe of claim 9, further comprising a binding material injected into a gap between the shell and the socket cavity to affix the shell to the socket cavity.

11. The electrical probe of claim 10, wherein the binding material is epoxy.

12. The electrical probe of claim 1, further comprising an other plunger having a tip configured to extend at least partially through an other opening formed at a second end of the shell opposite to the first end, wherein the biasing device is disposed between the plunger and the other plunger.

13. The electrical probe of claim 12, wherein the other opening at the second end is substantially closed by a retainer to hold the first and second plungers and the biasing device inside the internal cavity of the shell, and wherein the retainer comprises a retainer cavity through which the tip of the other plunger at least partially extends.

14. An electrical connector comprising:
a socket body comprising a plurality of socket cavities; and
a plurality of electrical probes disposed inside the corresponding plurality of socket cavities,
wherein each of the plurality of electrical probes comprises:
a shell affixed to an internal surface of each corresponding socket cavity, the shell extending along a longitudinal axis and defining an internal cavity with an opening at a first end, the shell comprising a neck portion defined by a hollow polygonal shaft twisted about the longitudinal axis to form an internal cam surface;
a plunger slidably received in the internal cavity, the plunger comprising:
a tip configured to extend at least partially through the opening at the first end; and
a cam element integrally formed with the tip, the cam element having a defined shape in a plane substantially perpendicular to the longitudinal axis, an outer perimeter of the defined shape being substantially congruent to, and less than, an inner perimeter of a cross-sectional portion of the hollow polygonal shaft, such that, when the plunger is reciprocated along the longitudinal axis of the shell, the cam element engages with the internal cam surface of the neck portion to cause rotation of the tip; and
a biasing device configured to exert a biasing force on the plunger.

15. The electrical connector of claim 14, wherein the cam element comprises substantially a polygonal plate.

16. The electrical connector of claim 15, wherein the cam element comprises a square plate having a thickness along the longitudinal axis smaller than a width in the plane substantially perpendicular to the longitudinal axis.

17. The electrical connector of claim 15, wherein the cam element is substantially non-twisted.

18. The electrical connector of claim 14, wherein the internal cam surface formed by the twisted hollow polygonal shaft comprises a spiral cam surface shaped and sized to receive the cam element.

19. A method of manufacturing an electrical connector, comprising:
inserting a plated mandrel into a socket cavity of a socket body, the plated mandrel having a plating layer on an outer surface of a mandrel, the mandrel comprising a neck portion defined by a substantially polygonal shaft twisted about a longitudinal axis;
securing the plated mandrel into the socket cavity;
removing the mandrel from the socket cavity while leaving at least a portion of the plating layer to form a shell secured to the socket cavity, an internal cavity of the shell comprising a cam surface defined by the twisted polygonal shaft of the neck portion; and
inserting a plunger and a biasing device into the internal cavity of the shell, the plunger comprising:
a tip; and
a cam element integrally formed with the tip, the cam element having a defined shape in a plane substantially perpendicular to the longitudinal axis, an outer perimeter of the defined shape being substantially congruent to, and less than, an inner perimeter of a cross-sectional portion of the polygonal shaft, such that, when the plunger is reciprocated along the longitudinal axis, the cam element engages with the cam surface of the shell to cause rotation of the tip.

20. The method of claim 19, wherein the cam element comprises substantially a polygonal plate.

21. The method of claim 20, wherein the cam element comprises a square plate having a thickness along the longitudinal axis smaller than a width in the plane substantially perpendicular to the longitudinal axis.

22. The method of claim 19, wherein the cam element is substantially non-twisted.

23. The method of claim 19, wherein the cam surface formed inside the shell by the twisted polygonal shaft comprises a spiral cam surface shaped and sized to receive the cam element.

24. The method of claim 19, wherein the neck portion of the mandrel is twisted less than approximately 90 degrees about the longitudinal axis.

25. The method of claim 19, wherein securing the plated mandrel into the socket cavity comprises injecting a binding material into a gap between the plated mandrel and the socket cavity to affix the plated mandrel to the socket cavity.

* * * * *